(12) United States Patent
Gao et al.

(10) Patent No.: US 7,737,743 B1
(45) Date of Patent: Jun. 15, 2010

(54) PHASE-LOCKED LOOP INCLUDING SAMPLING PHASE DETECTOR AND CHARGE PUMP WITH PULSE WIDTH CONTROL

(75) Inventors: Xiang Gao, Enschede (NL); Eric A. M. Klumperink, Enschede (NL); Bram Nauta, Enschede (NL); Mounir Bohsali, Albany, CA (US); Ali Kiaei, Santa Clara, CA (US); Gerard Socci, Palo Alto, CA (US); Ali Djabbari, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/044,522

(22) Filed: Mar. 7, 2008

(51) Int. Cl.
*H03L 7/06* (2006.01)

(52) U.S. Cl. .................. 327/158; 327/156; 327/163; 375/375; 375/376

(58) Field of Classification Search ............ 327/12, 327/141, 144–163; 331/1 A, 15–17; 375/373–376
See application file for complete search history.

(56) References Cited

U.S. PATENT DOCUMENTS

| | | | | |
|---|---|---|---|---|
| 6,055,286 | A * | 4/2000 | Wu et al. | 375/375 |
| 6,081,572 | A * | 6/2000 | Filip | 375/376 |
| 2008/0218274 | A1* | 9/2008 | Clementi | 331/16 |

OTHER PUBLICATIONS

Anand et al., "A CMOS Clock Recovery Circuit for 2.5-Gb/s NRZ Data", IEEE Journal of Solid-State Circuits, vol. 36, No. 3, Mar. 2001, pp. 432-439.
Maulik et al., "A 150 MHz-400MHz DLL-Based Programmable Clock Multiplier with -70dBc Reference Spur in 0.18um CMOS", IEEE 2006, CICC, pp. 757-760.
Desgrez et al., "A New MMIC Sampling Phase Detector Design for Space Applications", IEEE Journal of Solid State-Circuits, vol. 38, No. 9, Sep. 2003, pp. 1438-1442.

* cited by examiner

*Primary Examiner*—Lincoln Donovan
*Assistant Examiner*—Brandon S Cole
(74) *Attorney, Agent, or Firm*—Vedder Price, P.C.

(57) ABSTRACT

Phase-locked loop (PLL) circuitry in which a sampling phase detector samples the output signal in accordance with the reference signal and a frequency detector detects the output signal frequency in accordance with the reference signal.

14 Claims, 4 Drawing Sheets

PHASE-LOCKED LOOP INCLUDING SAMPLING PHASE DETECTOR AND CHARGE PUMP WITH PULSE WIDTH CONTROL

BACKGROUND

1. Field of the Invention

The present invention relates to phase detectors, and in particular, to sampling phase detectors.

2. Related Art

Referring to FIG. 1, the classical phase-locked loop (PLL) 10 has an architecture as shown with a phase frequency detector and charge pump 12, a low pass filter 14, a voltage controlled oscillator (VCO) 16, and a frequency divider 18 with divider ratio N, all interconnected substantially as shown. As is well known, the divider 18 in the feedback loop is used to provide frequency down conversion to ensure a correct frequency relationship between the input reference signal 11 and the output signal 17. While useful and widely used, such an architecture has two basic limitations: tradeoff between loop noise and VCO noise; and multiplication of loop phase noise power by the square of the divider ratio ($N^2$) transferred to the output.

Referring to FIG. 2, an alternative PLL architecture 20 uses a sampling phase detector and charge pump 22, thereby avoiding the need for a feedback frequency divider. The VCO output signal 17 is sub-sampled by the reference clock 11. Such sampling phase detectors are well known, and are often used in clock data recovery (CDR) circuits and delay locked loop (DLL) circuits.

Referring to FIG. 3, such a PLL architecture 20 performs sub-sampling with a sample-and-hold (S&H) circuit 22a, the primary elements of which (in its most simplified representation) are a serial switch circuit 24 and shunt capacitance 26. By avoiding the use of a feedback frequency divider, the frequency divider noise is eliminated.

Referring to FIG. 4, in such a sub-sampling process, the sine wave VCO output signal 17 with frequency $f_{VCO}$ is sampled by pulses with the clock signal 11 frequency $f_{ref}$, where $f_{VCO}=N*f_{ref}$. With an integer ratio N, the sub-sampler output voltage 23 should ideally be a constant DC voltage $V_{sam}$.

Referring to FIGS. 3A and 4A, in accordance with a more practical implementation, the S&H circuit 22b includes serial switch circuits 24a, 24b and with the shunt capacitance implemented as two capacitors 26a, 26b. The VCO output signal 17 is sampled by non-overlapping reference clock signals 11p, 11n such that the VCO output signal 17 is sampled by the first clock signal 11p and the first sampled signal 23a is sampled by the second clock signal 11n to produce the final sub-sampler output voltage 23 with a constant DC voltage $V_{sam}$ when $f_{OSC}=N*f_{ref}$.

Such conventional sampling phase detectors, however, have their own disadvantages. For example, one property of a sampling phase detector is a large detection gain. In order to use it in a feedback loop like a DLL or PLL and ensure loop stability, either the performance of the phase detector must be sacrificed or an external loop filter with a low bandwidth, and, therefore, large capacitances, must be used. Such an external loop filter, of course, generally prevents such a phase detector from being fully integrated on a chip.

SUMMARY OF THE INVENTION

In accordance with the presently claimed invention, phase-locked loop (PLL) circuitry is provided in which a sampling phase detector samples the output signal in accordance with the reference signal and a frequency detector detects the output signal frequency in accordance with the reference signal.

In accordance with one embodiment of the presently claimed invention, phase-locked loop (PLL) circuitry includes:

sampling phase detection circuitry responsive to a reference signal and an oscillation signal by providing a sampled signal;

signal combining circuitry coupled to the sampling phase detection circuitry and responsive to the sampled signal and a detected signal by providing a combination signal;

filter circuitry coupled to the signal combining circuitry and responsive to the combination signal by providing a filtered signal;

oscillator circuitry coupled to the filter circuitry and the sampling phase detection circuitry, and responsive to the filtered signal by providing the oscillation signal; and frequency lock circuitry coupled to the oscillator circuitry and responsive to the reference signal and the oscillation signal by providing the detected signal.

In accordance with another embodiment of the presently claimed invention, phase-locked loop (PLL) circuitry includes:

sampling phase detector means for receiving a reference signal and an oscillation signal and in response thereto providing a sampled signal;

signal combiner means for combining the sampled signal and a detected signal to provide a combination signal;

filtering means for filtering the combination signal to provide a filtered signal;

oscillator means for receiving the filtered signal and in response thereto providing the oscillation signal; and frequency locking means for receiving the reference signal and the oscillation signal and in response thereto providing the detected signal.

In accordance with another embodiment of the presently claimed invention, a method of providing a phase-locked signal includes:

sampling an oscillation signal in accordance with the reference signal to provide a sampled signal;

combining the sampled signal and a detected signal to provide a combination signal;

filtering the combination signal to provide a filtered signal;

generating the oscillation signal in accordance with the filtered signal; and frequency detecting the oscillation signal in accordance with the reference signal to provide the detected signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
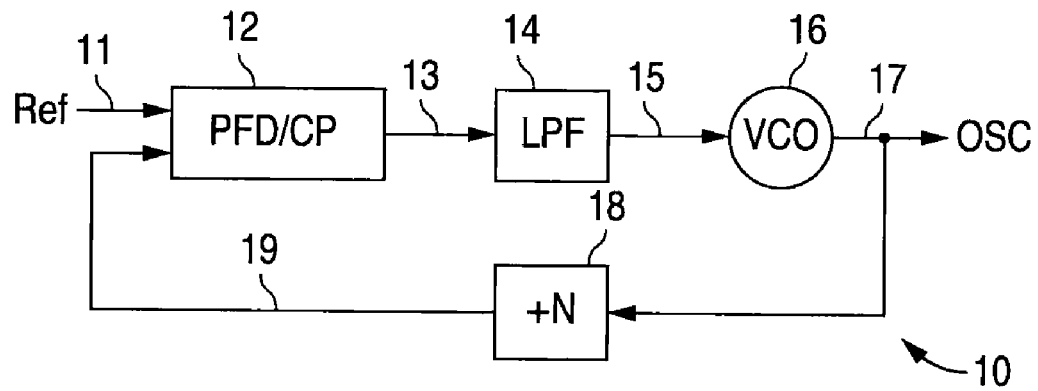
FIG. 1 is a block diagram of a conventional PLL architecture.
Figure 2:
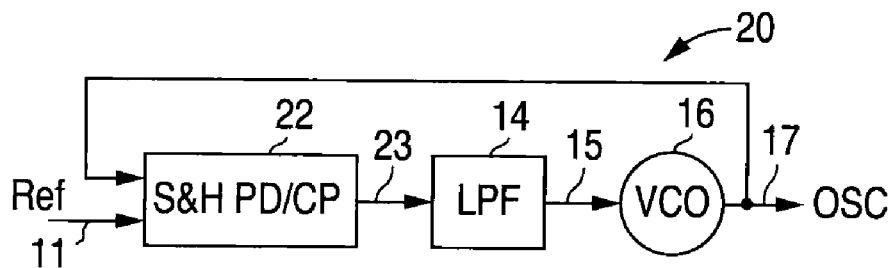
FIG. 2 is a block diagram of a conventional PLL architecture using sub-sampling.
Figure 3:
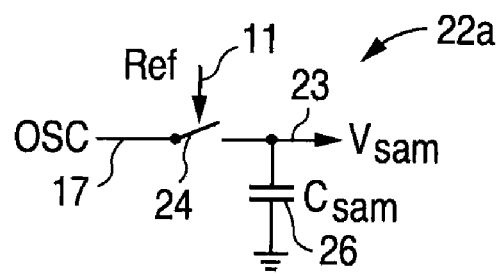
FIGS. 3 and 3A are simplified schematics of conventional S&H circuits.
Figure 3A:
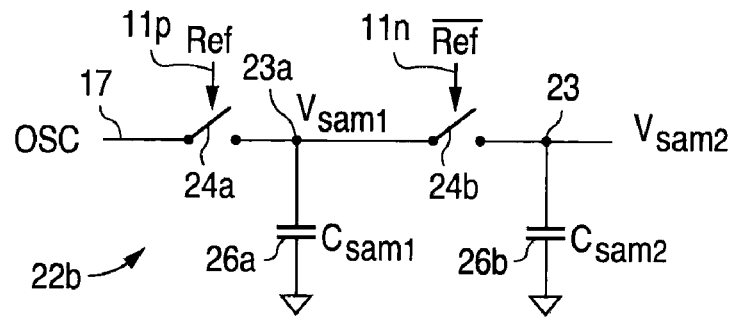
Figure 4:
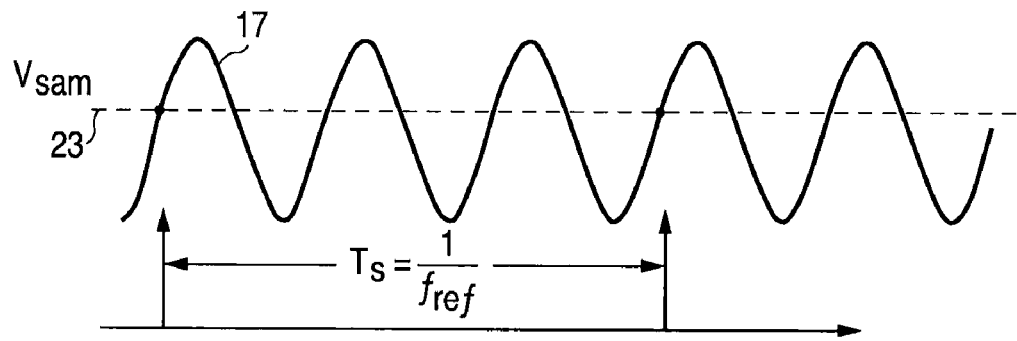
FIGS. 4 and 4A illustrate sub-sampling processes for an integer ratio N in the circuits of FIGS. 3 and 3A, respectively.
Figure 4A:
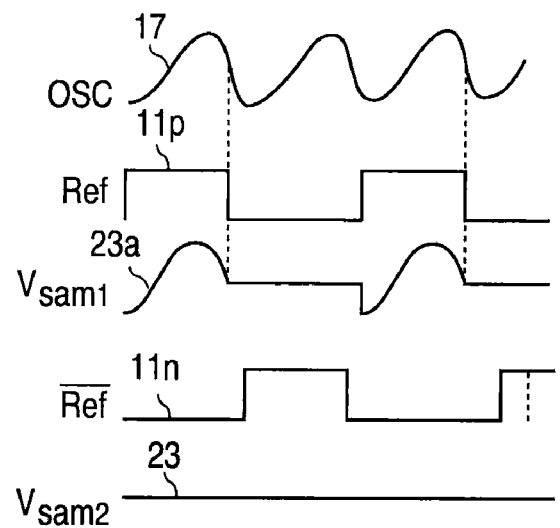
Figure 5:
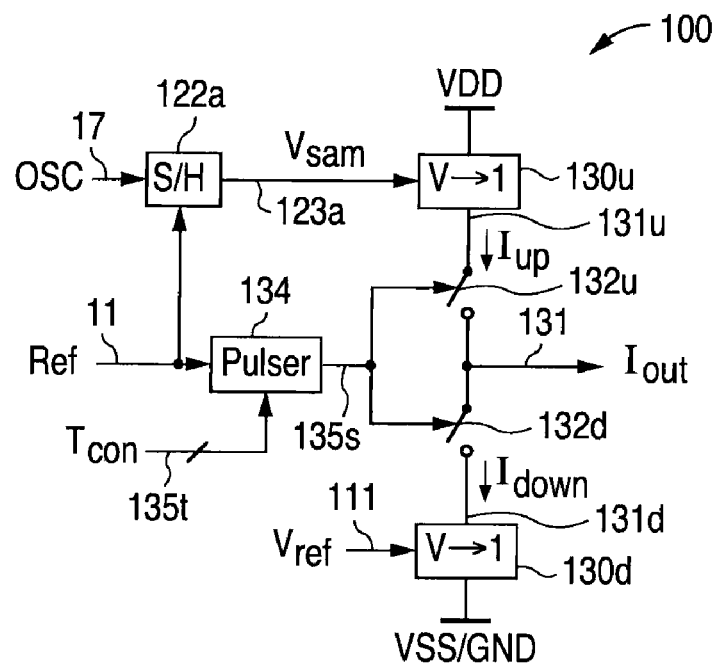
FIG. 5 is a block diagram of a sampling phase detector and charge pump with pulse width control in accordance with one embodiment of the presently claimed invention.

Referring to FIG. 5, a sampling phase detector and charge pump 100 in accordance with one embodiment of the presently claimed invention includes S&H circuitry 122a, voltage-to-current circuitry 130u, 130d, switch circuitry 132u, 132d, and pulser circuitry 134 (discussed in more detail below), all interconnected substantially as shown. The oscillator output signal 117 is sub-sampled by the S&H circuitry 122a in accordance with the reference signal 11. The resulting sample signal 123a drives the upper voltage-to-current circuit 130u which, in accordance with the magnitude of the sample signal 123a, provides a corresponding source current 131u for the charge pump. The lower voltage-to-current circuit 130d is driven by a reference voltage 111 having a magnitude $V_{ref}$ equal to the magnitude $V_{sam}$ of the nominal output voltage 123a of the S&H circuit 122a when the phase error between the oscillator signal 17 and reference clock 11 is zero. In accordance with this reference voltage 111, the lower voltage-to-current circuit 130d provides the sink current 131d for the charge pump. The switch circuits 132u, 132d control the conveyance of the source current 131u and sink 132d currents to and from the output electrode through which the resulting output current 131 flows. When these switches 132u, 132d are closed, the net charge pump output current 131 equals the sum of the source 131u and sink 131d currents ($I_{up}$-$I_{down}$). When these switches 132u, 132d are open, the output current 131 is zero.

The output switches 132u, 132d are controlled with one or more control signals 135s provided by the pulser 134. The pulser 134 is controlled by the reference clock signal 111 to provide the one or more output signals 135s as one or more pulse signals having the same period $T_{ref}$ as the reference clock 11 and a pulse duration τ which is controllable by one or more control signals 135t, thereby producing a duty cycle of τ/$T_{ref}$. This causes the switches 132u, 132d to be switched on or off simultaneously, thereby making the charge pump active only during the short time τ within one reference clock signal period $T_{ref}$. Hence, the amount of the charge pump output current 131, and thus the phase detector and charge pump gain, is controlled by the pulse width τ. This simultaneous switching of the charge pump output current 131 also prevents ripple from appearing on the output current 131 when the phase error between the oscillator signal 17 and reference clock 11 is zero, even if a mismatch exists between the source 131u and sink 131d currents.

To calculate the gain of a sampling phase detector and charge pump in accordance with the presently claimed invention, it is assumed that the oscillator output signal 17 is a sine wave with a DC voltage $V_{DC}$, an amplitude $A_{VCO}$, and a phase $\Phi_{VCO}$, as a result of which:

$$V_{OSC} = V_{DC} + A_{VCO} * \sin(\Phi_{VCO}) \quad (1)$$

It is further assumed that the voltage-to-current converters 130u, 130d each have a gain of $g_m$ and the reference voltage 111 is chosen to have the same DC voltage as the oscillator signal 17, i.e., $V_{ref} = V_{OSC}$, where the oscillator signal 17 has a maximum slew rate, and the phase detector and charge pump has the best linearity, thereby allowing the gain of the sampling phase detector and charge pump around zero phase error to be calculated as follows:

$$K_{PD/CP} = \frac{\Delta I}{\Delta \Phi} = A_{VCO} \cdot g_m \frac{\tau}{T_{ref}} \quad (2)$$

The gain of the sampling phase detector and charge pump 100 is attenuated in accordance with the duty cycle τ/$T_{ref}$. When such a sampling phase detector and charge pump 100 is used in a DLL or PLL, no large capacitances will be required, thereby allowing full integration on a chip with selection of an appropriate pulse duration τ. Further, the sampling phase detector and charge pump 100 gain can be selectively controlled by changing the pulse duration τ on-chip or off-chip without changing the oscillator signal 17 amplitude $A_{VCO}$ or voltage-to-current converter 130u, 130d gain $g_m$, i.e., without changing the circuit, thereby providing additional flexibility for loop control.

Figure 6:
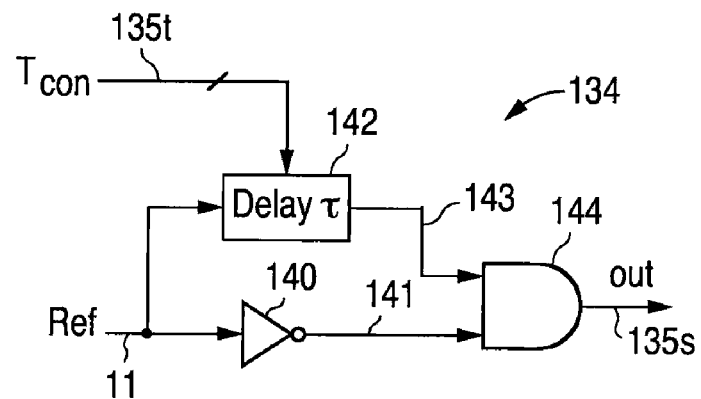
FIG. 6 is a logic diagram for one example of the pulser of FIG. 5.
Figure 7:
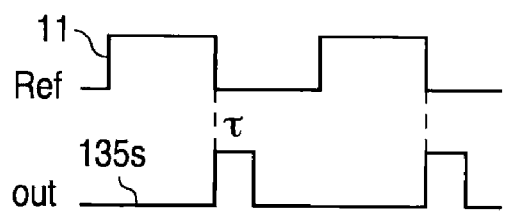
FIG. 7 is a signal timing diagram for the input and output signals of FIG. 6.

Referring to FIGS. 6 and 7, in accordance with one embodiment of the presently claimed invention, the pulser 134 includes a signal inverter 140, a delay circuit 142 (e.g., shift register) and a logical AND circuit 144, interconnected substantially as shown. The inverted reference clock 141 and a delayed version 143 of the reference clock 11 are logically ANDed to produce the output signal 135s. The amount of delay imposed by the delay circuit 142 can be controlled by the one or more control signals 135t in accordance with well known techniques.

As noted above, one or more switch control signals 135s can be provided, depending upon the configuration of the switch circuits 132u, 132d. For example, if both switch circuits 132u, 132d are implemented as pass transistors, e.g., using single NMOS transistors, a single control signal 135s can be used. Alternatively, if the switch circuits 132u, 132d are implemented as transmission gates, e.g., with complementary MOS transistors, dual opposing control signals 135*s* can be provided to drive the transistors in accordance with well known techniques.

Figure 8:
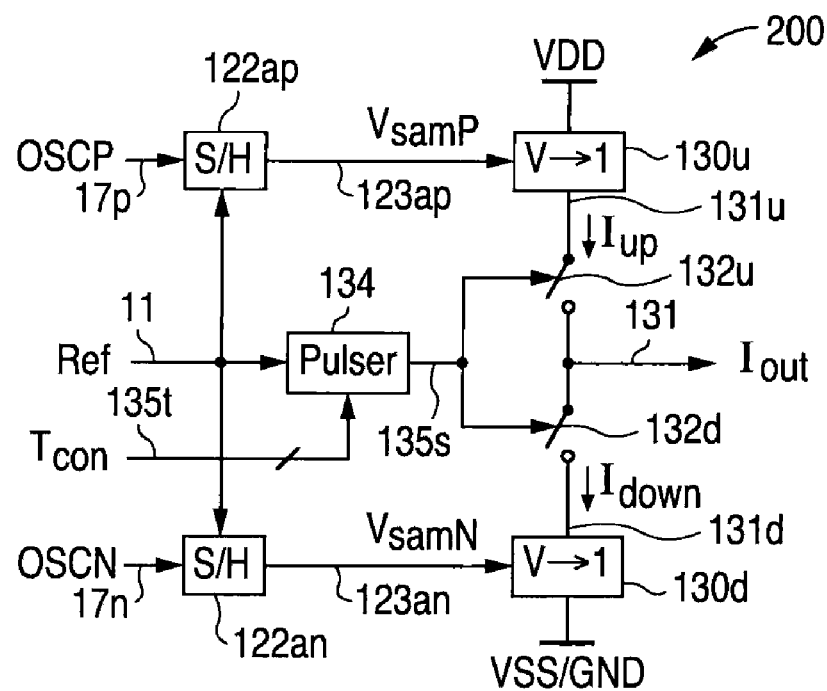
FIG. 8 is a block diagram of a sampling phase detector and charge pump with pulse width control in accordance with another embodiment of the presently claimed invention.

Referring to FIG. 8, in accordance with an alternative embodiment 200 of the presently claimed invention, the sampling phase detector and charge pump can accept a differential oscillator signal 17 having positive 17*p* and negative 17*n* signal phases. In this embodiment 200, both signal phases 17*p*, 17*n* are sampled by respective S&H circuits 122*ap*, 122*an*, with the resulting sample signals 123*ap*, 123*an* controlling the upper 130*u* and lower 130*d* voltage-to-current converter circuits (thereby avoiding the need for a reference voltage 111). The zero phase error locking point is when the two sample voltages 123*ap*, 123*an* are equal, which is indicative of the crossing point of the oscillator differential output.

Figure 9:
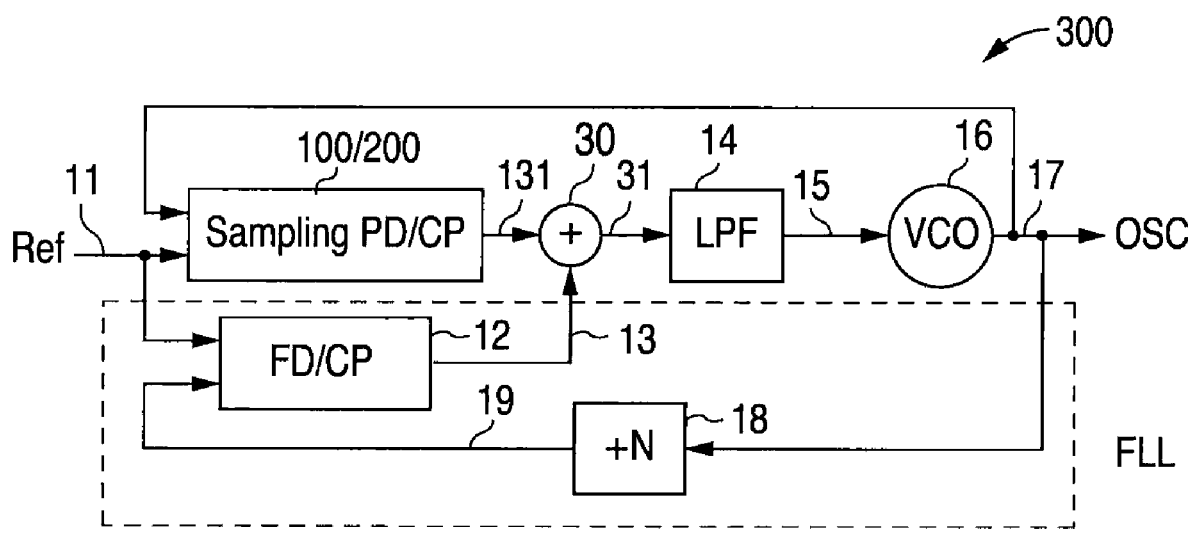
FIG. 9 is a block diagram of an integer-N PLL using a sampling phase detector and charge pump with pulse width control in accordance with the presently claimed invention, along with a frequency-locked loop (FLL).

Referring to FIG. 9, one example of an application using a sampling phase detector and charge pump in accordance with the presently claimed invention is an integer-N PLL 300 which also includes a FLL. The FLL includes the feedback frequency divider 18, and a frequency detector and charge pump circuit 12, the output 13 of which is summed with the output 131 of the sampling phase detector and charge pump 100/200. The FLL facilitates frequency acquisition since the sampling phase detector and charge pump 100/200 has limited frequency discrimination. Therefore, once frequency lock has been achieved, the FLL can be shut down or switched out, e.g., by switching off the output 13 of the frequency detector and charge pump 12, thereby reducing power consumption by and noise injection from the FLL.

As discussed above, a PLL using a sampling phase detector and charge pump in accordance with the presently claimed invention can be fully integrated in a chip. Further, it can be easily shown that such a PLL will have lower phase noise than a conventional integer-N PLL due to the absence of the well known amplification factor $N^2$ for phase detector and charge pump noise, as well as the absence of feedback frequency divider noise. Additionally, spurious signal components are reduced.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including integer-N phase-locked loop (PLL) circuitry, to provide an oscillator signal with a frequency that is N-times the frequency of a reference signal, comprising:

sampling phase detection circuitry responsive to said reference signal and said oscillation signal by sampling said oscillation signal in accordance with said reference signal and providing a phase detection signal related to a phase difference between said reference signal and said oscillation signal;

signal combining circuitry coupled to said sampling phase detection circuitry and responsive to said phase detection signal and a frequency detection signal by providing an oscillator control signal;

oscillator circuitry coupled to said signal combining circuitry and said sampling phase detection circuitry, and responsive to said oscillator control signal by providing said oscillation signal at a frequency that is N-times said frequency of said reference signal; and divide-by-N frequency lock circuitry, including divide-by-N circuitry, coupled to said oscillator circuitry and responsive to said reference signal and said oscillation signal by providing said frequency detection signal related to a frequency difference between said reference signal and said oscillation signal divided by N;

wherein, when said divide-by-N frequency lock circuitry establishes a frequency lock between said reference signal and said oscillation signal divided by N, said oscillation control signal and said oscillation signal are controlled by said sampling phase detection circuitry and phase detection signal.

2. The apparatus of claim 1, wherein said sampling phase detection circuitry comprises:

sample-and-hold circuitry responsive to said reference signal by sampling said oscillation signal to provide a voltage sample signal corresponding to a sampled portion of said oscillation signal;

charge-pump circuitry, including charge-pump capacitance, coupled to said sample-and-hold circuitry and responsive to at least said voltage sample signal by providing first and second currents which combine to provide a charge-pump control current that establishes a voltage across said charge pump capacitance as said phase detection signal; and pulser circuitry coupled to said charge-pump circuitry and responsive to said reference signal and a duty cycle control signal by controlling said first and second currents to provide said charge-pump control current which establishes said phase detection signal;

wherein said reference signal has a reference signal period, and said duty cycle control signal is configured to define within said reference signal period a charging portion and a non-charging portion such that, during said charging portion, said charge pump control current is substantially equal to a sum of said first and second currents, and during said non-charging portion, said charge pump control current is substantially fixed independent of said first and second currents.

3. The apparatus of claim 2, wherein said pulser circuitry comprises:

signal inverter circuitry responsive to said reference signal by providing an inverted reference signal;

signal delay circuitry responsive to said reference signal by providing a delayed reference signal; and logic circuitry coupled to said signal inverter circuitry and said signal delay circuitry, and responsive to said inverted and delayed reference signals by providing said duty cycle control signal.

4. The apparatus of claim 2, wherein:

said oscillation signal comprises a differential oscillation signal with first and second phases;

said voltage sample signal comprises a differential voltage sample signal with first and second phases;

said sample-and-hold circuitry is responsive to said reference signal by sampling said first and second differential oscillation signal phases to provide said first and second differential voltage sample signal phases; and said charge-pump circuitry is responsive to said first and second differential voltage sample signal phases by providing said first and second currents, respectively.

5. The apparatus of claim 1, wherein said signal combining circuitry comprises signal summing circuitry.

6. The apparatus of claim 1, further comprising filter circuitry coupled to said signal combining circuitry to low pass filter said oscillator control signal.

7. The apparatus of claim 1, wherein said oscillator circuitry comprises voltage-controlled oscillator circuitry.

8. The apparatus of claim 1, wherein said divide-by-N frequency lock circuitry is disabled following said frequency lock between said reference signal and said oscillation signal divided by N.

9. An apparatus including integer-N phase-locked loop (PLL) to provide an oscillator signal with a frequency that is N-times the frequency of a reference signal, comprising:
   sampling phase detector means for receiving said reference signal and said oscillation signal and in response thereto sampling said oscillation signal in accordance with said reference signal and providing a phase detection signal related to a phase difference between said reference signal and said oscillation signal;
   signal combiner means for combining said phase detection signal and a frequency detection signal to provide an oscillator control signal;
   oscillator means for receiving said oscillator control signal and in response thereto providing said oscillation signal at a frequency that is N-times said frequency of said reference signal; and
   divide-by-N frequency locking means for receiving said reference signal and said oscillation signal and in response thereto providing said frequency detection signal related to a frequency difference between said reference signal and said oscillation signal divided by N;
   wherein, when said divide-by-N frequency locking means establishes a frequency lock between said reference signal and said oscillation signal divided by N, said oscillation control signal and said oscillation signal are controlled by said sampling phase detector means and phase detection signal.

10. The apparatus of claim 9, wherein said sampling phase detector means comprises:
   sample-and-hold means for receiving said reference signal and in response thereto sampling said oscillation signal to provide a voltage sample signal corresponding to a sampled portion of said oscillation signal;
   charge-pump means, including capacitive means, for receiving at least said voltage sample signal and in response thereto providing first and second currents which combine to provide a charge-pump control current that establishes a voltage across said capacitive means as said phase detection signal; and
   pulser means for receiving said reference signal and a duty cycle control signal and in response thereto controlling said first and second currents to provide said charge-pump control current which establishes said phase detection signal;
   wherein said reference signal has a reference signal period, and said duty cycle control signal is configured to define within said reference signal period a charging portion and a non-charging portion such that, during said charging portion, said charge pump control current is substantially equal to a sum of said first and second currents, and during said non-charging portion, said charge pump control current is substantially fixed independent of said first and second currents.

11. The apparatus of claim 10, wherein said pulser means comprises:
   signal inverter means for receiving said reference signal and in response thereto providing an inverted reference signal;
   signal delay means for receiving and delaying said reference signal to provide a delayed reference signal; and
   signal combiner means for receiving and combining said inverted and delayed reference signals to provide said duty cycle control signal.

12. The apparatus of claim 10, wherein:
   said oscillation signal comprises a differential oscillation signal with first and second phases;
   said voltage sample signal comprises a differential voltage sample signal with first and second phases;
   said sample-and-hold means is for receiving said reference signal and in response thereto sampling said first and second differential oscillation signal phases to provide said first and second differential voltage sample signal phases; and
   said charge-pump means is for receiving said first and second differential voltage sample signal phases and in response thereto providing said first and second currents, respectively.

13. The apparatus of claim 9, further comprising filter means for low pass filtering said oscillator control signal.

14. The apparatus of claim 9, wherein said divide-by-N frequency locking means is disabled following said frequency lock between said reference signal and said oscillation signal divided by N.

* * * * *